(12) United States Patent
Lin et al.

(10) Patent No.: US 11,646,232 B2
(45) Date of Patent: May 9, 2023

(54) METHOD OF MANUFACTURING SEMICONDUCTOR DEVICES AND SEMICONDUCTOR DEVICE

(71) Applicant: TAIWAN SEMICONDUCTOR MANUFACTURING CO., LTD., Hsinchu (TW)

(72) Inventors: Kun-Yu Lin, Kaohsiung (TW); Yu-Ling Ko, Hsinchu (TW); I-Chen Chen, Hsinchu (TW); Chih-Teng Liao, Hsinchu (TW); Yi-Jen Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 12 days.

(21) Appl. No.: 17/162,868

(22) Filed: Jan. 29, 2021

(65) Prior Publication Data
US 2021/0366777 A1    Nov. 25, 2021

Related U.S. Application Data

(60) Provisional application No. 63/028,900, filed on May 22, 2020.

(51) Int. Cl.
*H01L 21/8234*    (2006.01)
*H01L 29/78*    (2006.01)
*H01L 29/66*    (2006.01)

(52) U.S. Cl.
CPC ........ *H01L 21/823431* (2013.01); *H01L 29/66795* (2013.01); *H01L 29/785* (2013.01)

(58) Field of Classification Search
CPC ....... H01L 21/823431; H01L 29/66795; H01L 29/785; H01L 21/823821; H01L 21/845; H01L 27/0886; H01L 27/0924; H01L 27/10826; H01L 27/10879; H01L 27/1211; H01L 29/7853–7854; H01L 29/7851

See application file for complete search history.

(56) References Cited

U.S. PATENT DOCUMENTS

| | | | |
|---|---|---|---|
| 10,361,129 B1 * | 7/2019 | Sieg | ............... H01L 21/823412 |
| 2019/0221653 A1 | 7/2019 | Hsiao et al. | |
| 2020/0135571 A1 | 4/2020 | Wang et al. | |
| 2020/0135891 A1 | 4/2020 | Peng et al. | |

* cited by examiner

*Primary Examiner* — Cuong B Nguyen
(74) *Attorney, Agent, or Firm* — McDermott Will & Emery LLP

(57) ABSTRACT

In a method of manufacturing a semiconductor device, sacrificial patterns are formed over a hard mask layer disposed over a substrate, sidewall patterns are formed on sidewalls of the sacrificial patterns, the sacrificial patterns are removed, thereby leaving the sidewall patterns as first hard mask patterns, the hard mask layer is patterned by using the first hard mask patters as an etching mask, thereby forming second hard mask patterns, and the substrate is patterned by using the second hard mask patterns as an etching mask, thereby forming fin structures. Each of the first sacrificial patterns has a tapered shape having a top smaller than a bottom.

20 Claims, 12 Drawing Sheets

METHOD OF MANUFACTURING SEMICONDUCTOR DEVICES AND SEMICONDUCTOR DEVICE

RELATED APPLICATION

This application claims priority to U.S. Provisional Patent Application No. 63/028,900 filed on May 22, 2020, the entire disclosure of which is incorporated herein by reference.

BACKGROUND

As the semiconductor industry has progressed into nanometer technology process nodes in pursuit of higher device density, higher performance, lower power consumption and lower costs, challenges from both fabrication and design issues have resulted in the development of three-dimensional designs, such as a fin field effect transistor (Fin FET). In a Fin FET device, it is possible to utilize additional sidewalls and to suppress a short channel effect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
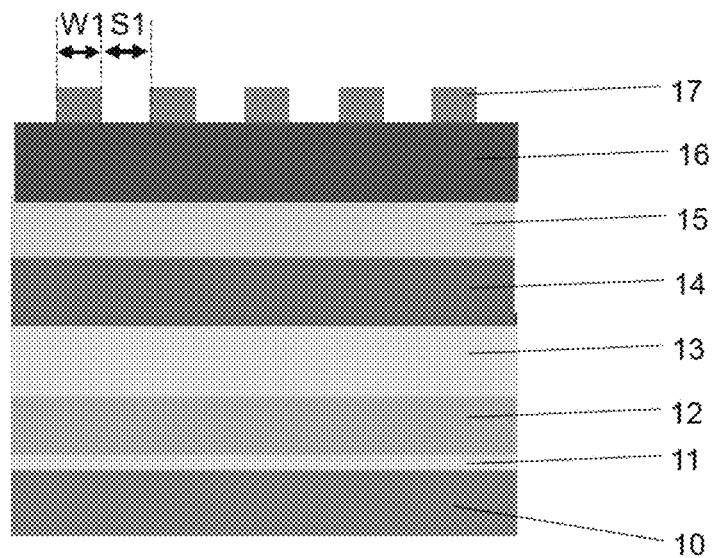
FIGS. 1, 2, 3, 4, 5, 6, 7, 8, 9, 10, 11, 12, 13, 14, 15, 16, 17 and 18 show cross sectional views of various stages of a sequential manufacturing operation for a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Fin structures used in FinFETs are manufactured by various patterning methods. When a critical dimension (CD) of a fin structure decreases below 20 nm, for example, it is generally difficult to directly form a pattern having such a small dimension by a single optical lithography process, and some fine patterning processes have been developed. For example, the fin structures may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer, which is often referred to as a mandrel pattern, is formed over a substrate and patterned using a photolithography process. Spacers are formed alongside the patterned sacrificial layer using a self-aligned process. The sacrificial layer is then removed, and the remaining spacers may then be used to pattern the fin structures. This operation may be repeated to manufacture desired fin patterns.

FIGS. 1-18 show various stages of a sequential manufacturing process of a semiconductor FinFET device according to embodiments of the present disclosure. It is understood that additional operations may be provided before, during, and after processes shown by FIGS. 1-18, and some of the operations described below can be replaced or eliminated in additional embodiments of the method. The order of the operations can be changed in some embodiments.

As shown in FIG. 1, multiple layers for hard masks are formed over a substrate 10 to be patterned into fin structures. In some embodiments, the substrate 10 is a silicon substrate. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof.

In some embodiments, a first layer 11 is formed over the substrate 10. In some embodiments, the first layer 11 is a pad silicon oxide layer formed by, for example, a thermal oxidation process or a chemical vapor deposition (CVD) process. In some embodiments, the thickness of the first layer 11 is in a range from about 1 nm to about 5 nm. Further, in some embodiments, a second layer 12 made of a different material than the first layer 11 is formed over the first layer 11. In some embodiments, the second layer 12 is a second pad layer or a hard mask layer including, for example, silicon nitride formed by, for example, a CVD or atomic layer deposition (ALD) process. In some embodiments, the thickness of the second layer 12 is in a range from about 2 nm to about 20 nm.

Further, in some embodiments, a third layer 13 made of a different material than the second layer 12 is formed over the second layer 12. In some embodiments, the third layer 13 is a hard mask layer formed by, for example, a CVD process. In some embodiments, the third layer 13 includes silicon oxide, SiON, SiOC, SiOCN, aluminum oxide or any other suitable material. In some embodiments, the thickness of the third layer 13 is in a range from about 5 nm to about 30 nm. In some embodiments, the third layer 13 is made of a same material as or a different material than the first layer 11.

Then, a fourth layer 14 made of a different material than the third layer 13 is formed over the third layer 13 in some embodiments. In some embodiments, the fourth layer 14 is a sacrificial layer for a mandrel pattern formed by, for example, a CVD process. In some embodiments, the fourth layer 14 includes amorphous or polycrystalline Si, SiGe or Ge, silicon oxide, SiOC, SiON, SiOCN or any other suitable material. In certain embodiments, non-doped poly silicon is used as the fourth layer 14. In some embodiments, the thickness of the fourth layer 14 is in a range from about 5 nm to about 30 nm. Further, in some embodiments, a fifth layer 15 made of a different material than the fourth layer 14 is formed over the fourth layer 14. In some embodiments, the fifth layer 15 is a hard mask layer formed by, for example, a CVD process. In some embodiments, the fifth layer 15 includes silicon oxide, silicon nitride, SiON, SiOC, SiOCN or any other suitable material. In certain embodiments, silicon nitride is used as the fifth layer 15. In some embodiments, the thickness of the fifth layer 15 is in a range from about 4 nm to about 20 nm.

Then, an organic bottom antireflective coating (BARC) layer 16 is formed over the fifth layer 15, and a photo resist layer is formed over the BARC layer 16 in some embodiments. Then, the photo resist layer is patterned by using a lithography operation, thereby forming a photo resist pattern 17, as shown in FIG. 1. In some embodiments, a width W1 of the photo resist pattern 17 is in a range from about 20 nm to about 100 nm and a space S1 is in a range from about 30 nm to about 200 nm, depending on design requirements. In some embodiments, the space S1 is greater than the width W1.

Figure 2:
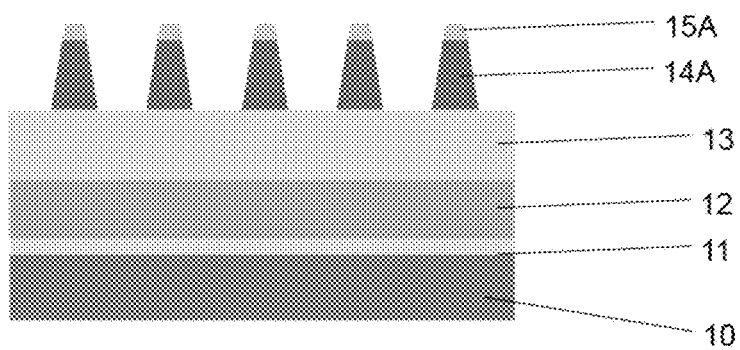

Then, the BARC layer 16 is patterned by using the photo resist pattern 17 as an etching mask, and the fifth layer 15 is further patterned using the patterned BARC layer 16 (and the photo resist pattern 17) as an etching mask, thereby forming a first hard mask pattern 15A. Then, the fourth layer (sacrificial layer) 14 is patterned using one or more plasma dry etching operations by using the first hard mask pattern 15A, thereby forming a mandrel pattern 14A, as shown in FIG. 2. Then, the first hard mask pattern 15A is removed as shown in FIG. 3 by wet and/or dry etching.

Figure 3:
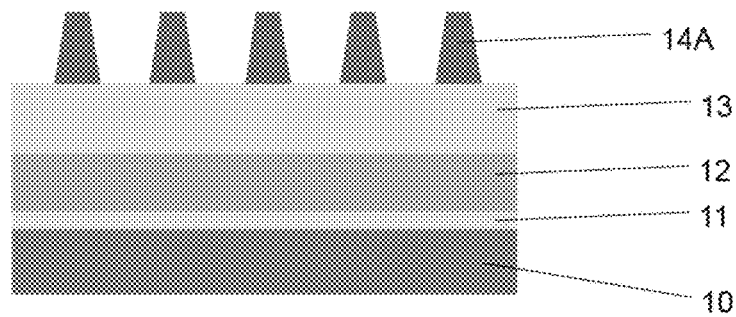

In some embodiments, the etching of the fourth layer 14 is a taper etching operation forming a trapezoidal cross sectional shape having a top smaller than the bottom as shown in FIGS. 2 and 3. The effects of the trapezoidal shape will be explained later.

Figure 4:
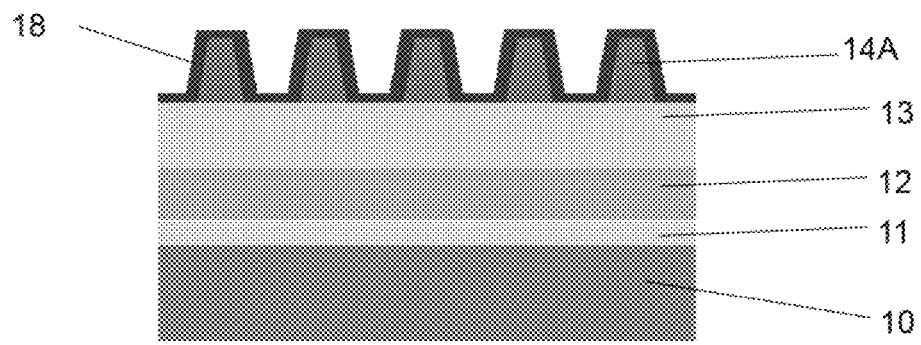

Then, as shown in FIG. 4, a sixth layer 18 for sidewall spacers is conformally formed on the mandrel pattern 14A and the exposed third layer 13. In some embodiments, the sixth layer 18 is made of a different material than the mandrel patterns 14A and the third layer 13, and includes silicon nitride, SiON, SiCN or any other suitable material. In certain embodiments, silicon nitride layer is used as the sixth layer 18. In some embodiments, the thickness of the sixth layer 18 is in a range from about 5 nm to about 15 nm, and is in a range from about 7 nm to about 12 nm in other embodiments, depending on design requirements and/or process requirements. In some embodiments, the sixth layer 18 is formed by an ALD process.

Figure 5:
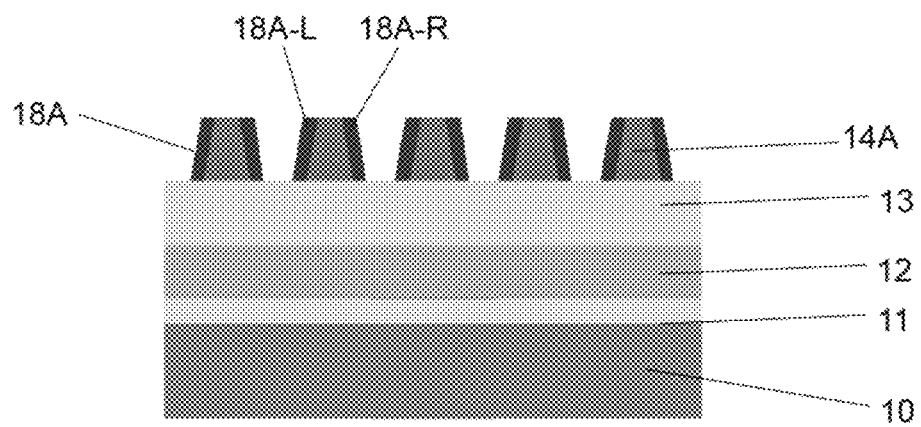

Next, as shown in FIG. 5, anisotropic etching is performed on the sixth layer 18 to remove the horizontal portions of the sixth layer 18 deposited on the top of the mandrel patterns 14A and the third layer 13 between the adjacent mandrel patterns 14A. As the result of the anisotropic etching, the sixth layer 18 remains as sidewall spacers 18A disposed on opposing side faces of the mandrel patterns 14A as shown in FIG. 5.

Figure 6:
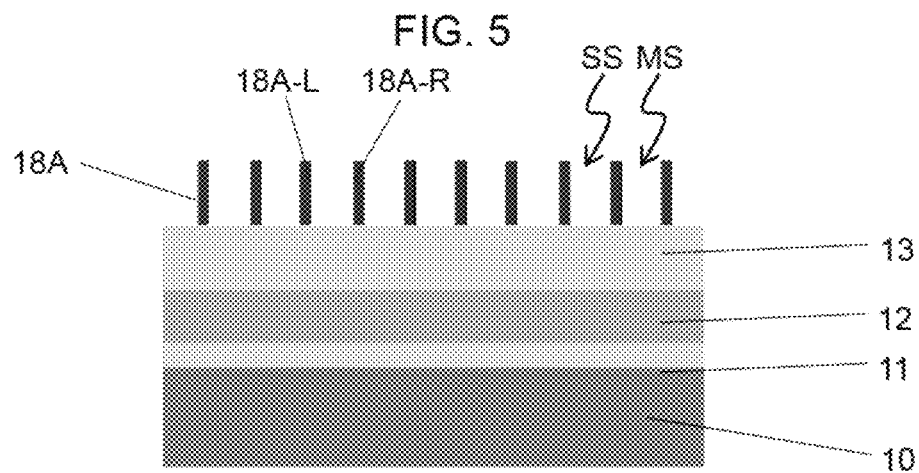

Then, as shown in FIG. 6, the mandrel patterns 14A are removed by one or more dry and/or wet etching operations, thereby leaving the sidewall spacers 18A as second hard mask patterns. As shown in FIG. 6, the second hard mask patterns 18A extend substantially vertically, due to the trapezoidal shape of the mandrel patterns 14A. The effects of the trapezoidal shape will be explained later. As shown in FIG. 6, a mandrel-space MS is a space from which a mandrel pattern 14A is remove and which is formed by a left sidewall 18A-L and a right sidewall 18A-R, and a spacer-space SS is a space where no a mandrel pattern 14A existed and which is formed by a right sidewall 18A-R and a left sidewall 18A-L. In some embodiments, the width and/or space of the mandrel patterns 14A and/or the thickness of the sixth layer 18 are adjusted or set such that the second hard mask patterns 18A have a substantially constant pitch. In some embodiments, a variation of the pitches is more than zero and less than about 0.5 nm. In some embodiments, the space between the second hard mask patterns 18A at the mandrel-space MS is greater than the space between the second hard mask patterns 18A at the spacer-space SS, and in other embodiments, the space between the second hard mask patterns 18A at the mandrel-space MS is smaller than the space between the second hard mask patterns 18A at the spacer-space SS.

Figure 7:
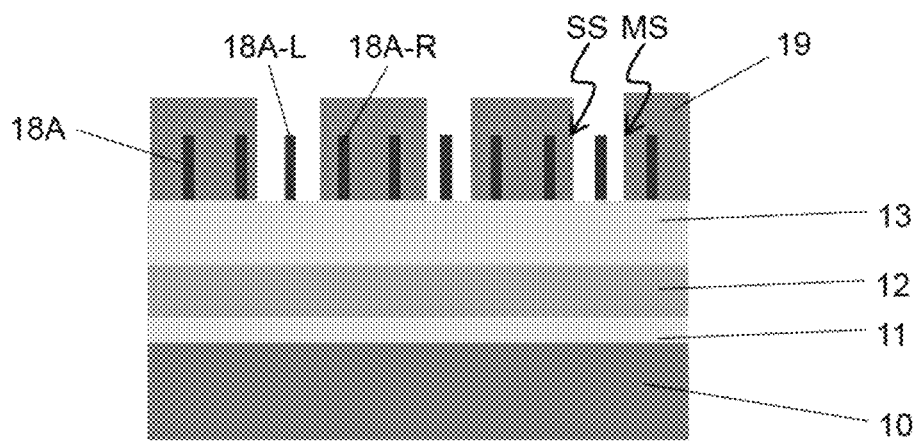
Figure 8:
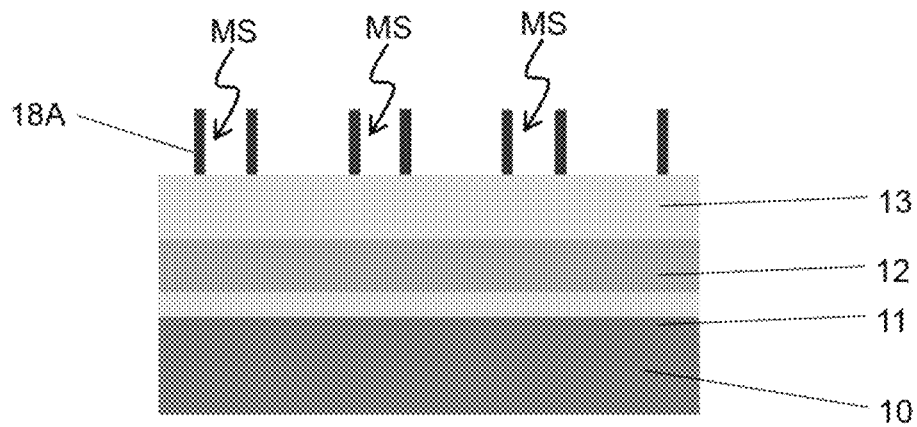

Next, as shown in FIG. 7, a mask pattern, such as a photo resist pattern 19, is formed over the second hard mask patterns 18A, and portions of the second hard mask patterns are removed and the second hard mask patterns are cut into pieces by one or more etching operations. As described later, the cut of second hard mask patterns 18A correspond to fin structures used in FinFETs. After the etching operation, the mask pattern 19 is removed as shown in FIG. 8. In some embodiments, the remaining hard mask patterns 18A constitute mandrel-spaces MS, as shown in FIG. 8. Further, in some embodiments, an isolated second hard mask pattern 18A (the rightmost pattern in FIG. 8), which is separated from adjacent hard mask pattern by a space greater than the space of the mandrel-space MS and/or spacer-space SS, is included.

Figure 9:
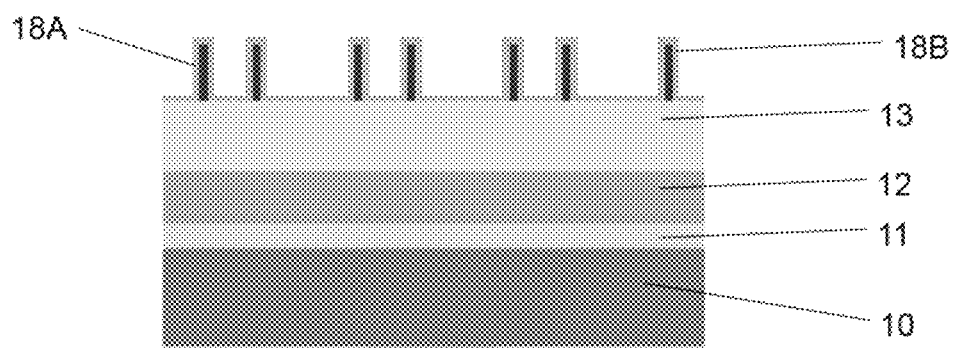

Then, as shown in FIG. 9, an optional additional hard mask layer 18B is conformally formed over the second hard mask layer 18A to adjust thickness (width) of the second hard mask layer 18A. In some embodiments, the additional hard mask layer 18B is made of the same or similar material to the second hard mask layer 18A, and includes silicon nitride, SiON, SiCN or any other suitable material, formed by an ALD process. In certain embodiments, silicon nitride is used as the additional hard mask layer 18B. In some embodiments, the thickness of the additional hard mask layer 18B is in a range from about 1 nm to about 2 nm. After the additional hard mask layer 18B is formed, anisotropic etching is performed to remove horizontal part of the deposited additional hard mask layer 18B in some embodiments.

Figure 10:
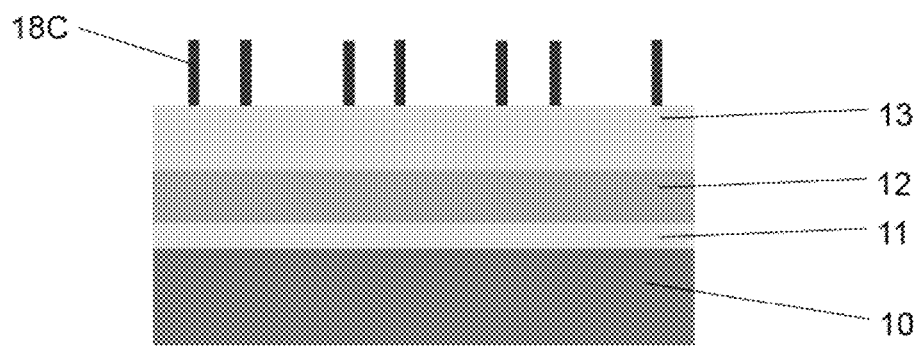
Figure 11:
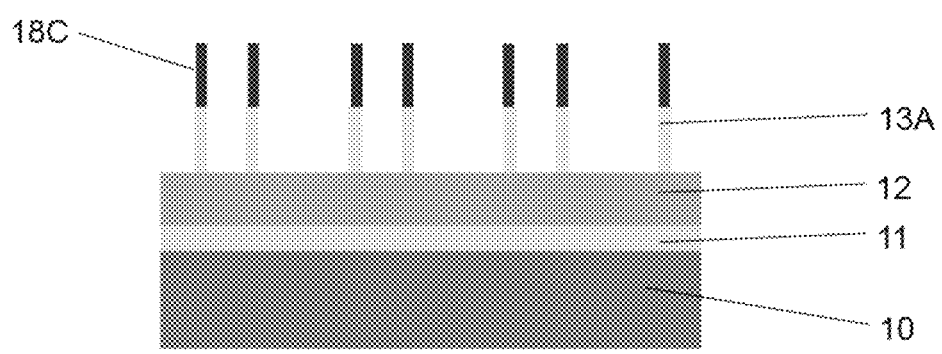
Figure 12:
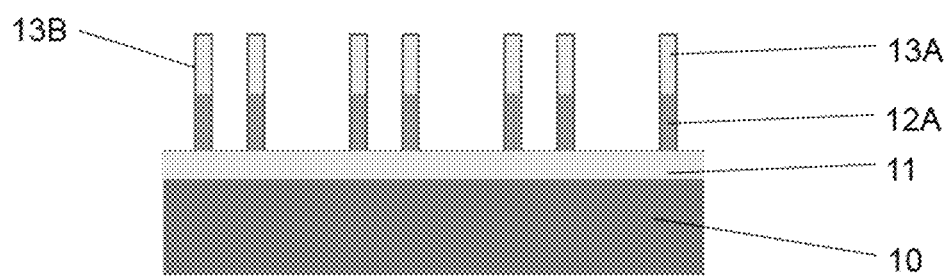

In FIG. 10, the combination of the second hard mask pattern 18A and the additional hard mask layer 18B are shown as hard mask pattern 18C. Then, as shown in FIG. 11, the third layer 13 is patterned by one or more plasma dry etching by using the hard mask pattern 18C as an etching mask, thereby forming a third hard mask pattern 13A. Then, the hard mask pattern 18C is removed by one or more dry and/or wet etching operations.

Further, the second layer 12 is patterned by one or more plasma dry etching using the third hard mask pattern 13A as an etching mask, thereby forming a fourth hard mask pattern 12A. In some embodiments, after the patterning operation, an additional hard mask layer 13B is conformally formed over the third hard mask pattern 13A and fourth hard mask pattern 12A to adjust thickness (width) of the hard mask pattern. In some embodiments, the additional hard mask layer 13B is made of the same or similar material to the third hard mask layer 13A, and includes silicon oxide, SiON, SiOC or any other suitable material, formed by an ALD process. In certain embodiments, silicon oxide is used as the additional hard mask layer 13B. In some embodiments, the thickness of the additional hard mask layer 13B is in a range from about 0.5 nm to about 2 nm. After the additional hard mask layer 13B is formed, anisotropic etching is performed to remove horizontal part of the deposited additional hard mask layer 13B in some embodiments.

Figure 13:
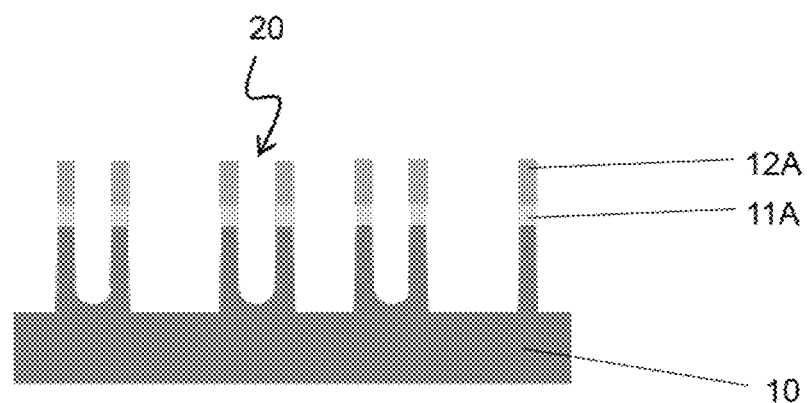

Then, the first layer 12 and the substrate 10 are patterned by one or more plasma dry etching using the hard mask pattern 13A and/or 12A as an etching mask, thereby forming fin structures 20 as shown in FIG. 13. In some embodiments, after the patterning etching, the hard mask pattern 12A and a patterned first layer 11A remain on the top of each of the fin structures 20. In some embodiments, the hard mask pattern 13A is removed during and/or after the patterning of the substrate 10.

Figure 14:
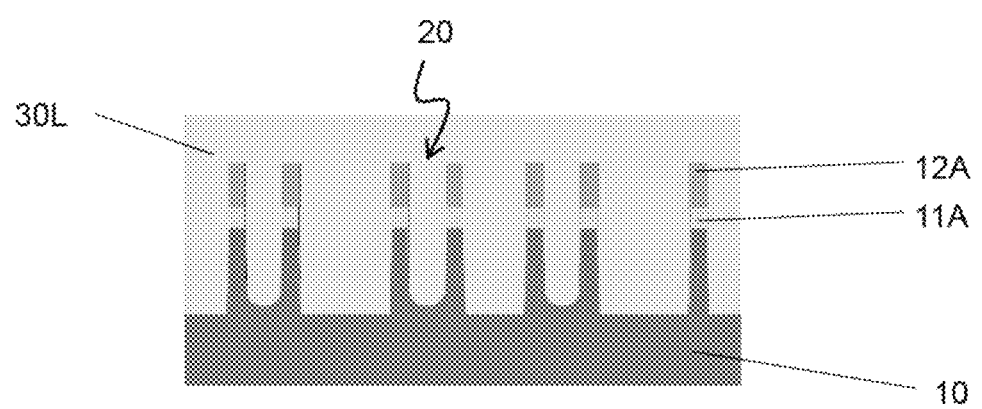

Then, an insulating layer 30L for an isolation insulating layer is formed to fully cover the fin structures as shown in FIG. 14. The insulating layer 30L includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), a mixture of MSQ and HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. The flowable film may be doped with boron and/or phosphorous. The insulating layer 30L may be formed by one or more layers of spin-on-glass (SOG), SiO, SiON, SiOCN and/or fluoride-doped silicate glass (FSG) in some embodiments.

In some embodiments, before the insulating layer 30L is formed, one or more fin liner layers (not shown) are conformally formed on the fin structures 20. In some embodiments, the fin liner layer includes a first layer and a second layer made of a different material than the first layer. In some embodiments, the fin liner layers are formed of silicon nitride or a silicon nitride-based material (e.g., silicon oxynitride, silicon carbon nitride, or silicon carbon oxynitride) and a silicon oxide based material (e.g., silicon oxide, or silicon carbon oxide). In some embodiments, the thickness of each of the first and second fin liner layers is in a range from about 1 nm to about 5 nm.

Figure 15:
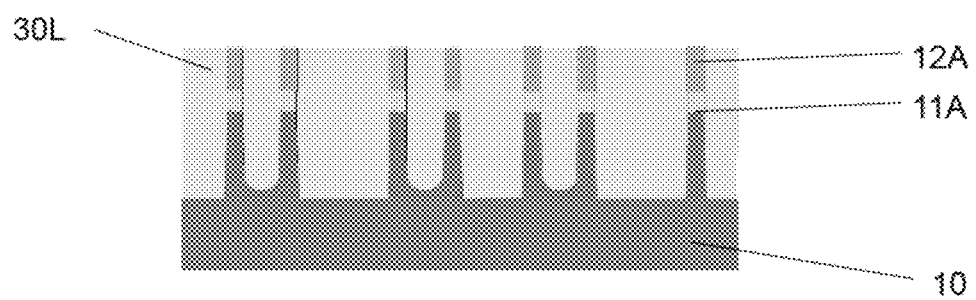
Figure 16:
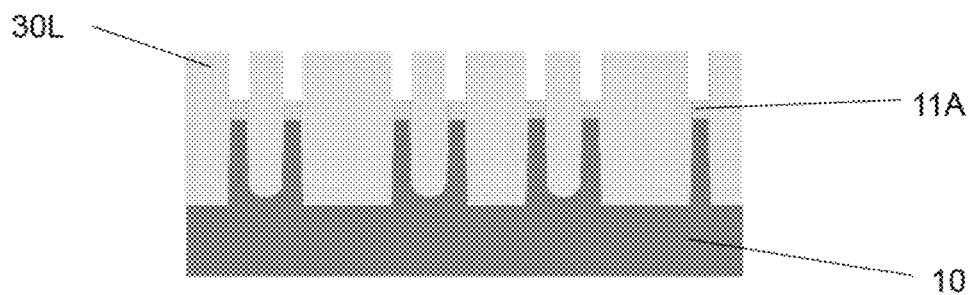

Then, one or more planarization operations, such as an etch back operation or a chemical mechanical polishing (CMP) operation, are performed to expose the hard mask pattern 12A as shown in FIG. 15. Subsequently, the hard mask pattern 12A is removed as shown in FIG. 16 by one or more wet and/or dry etching operations.

Figure 17:
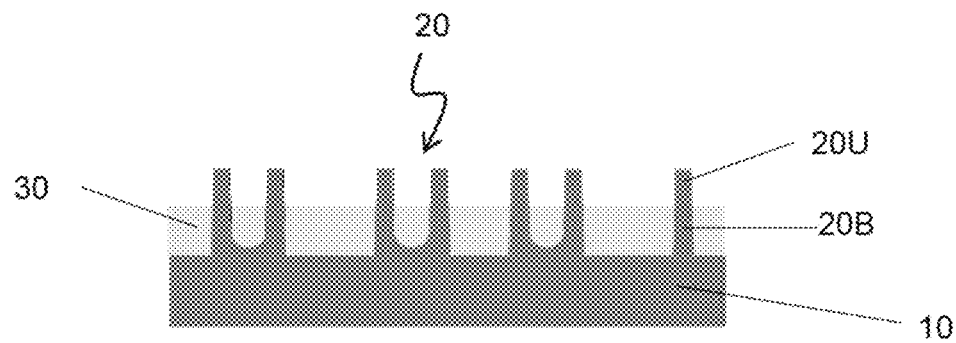

Further, the insulating layer 30L is recessed, thereby forming an isolation insulating layer 30 as shallow trench isolation (STI), as shown in FIG. 17. As shown in FIG. 17, an upper portion of the fin structure 20U protrudes from the isolation insulating layer 30 and a lower portion of the fin structure 20B is embedded in the isolation insulating layer 30. In some embodiments, during or after the recess etching, the patterned first layer 11A is removed. When the fin liner layer is formed, the fin liner layer is also recessed during and/or after the insulating layer 30L is recessed.

Figure 18:
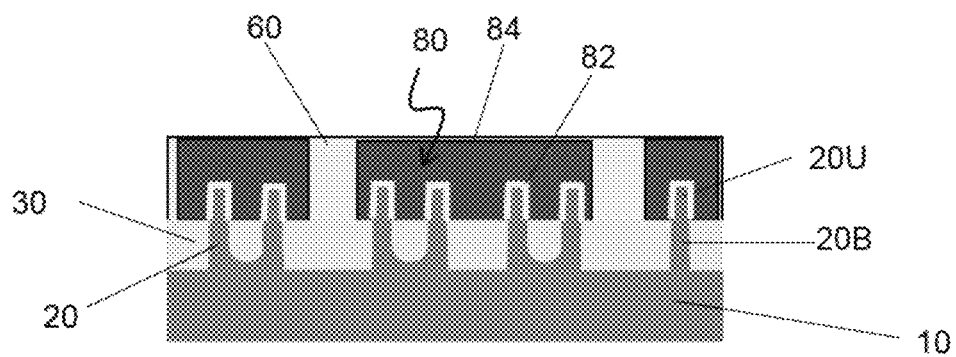

After the fin structures 20 are formed, a sacrificial gate structure is formed over the channel region of the fin structures, a source/drain epitaxial layer is formed at the source/drain region of the fin structure, and one or more dielectric layers 60 are formed over the sacrificial gate structure and the source/drain epitaxial layer. Further, the sacrificial gate structure is replaced with a metal gate structure, as shown in FIG. 18. In some embodiments, the metal gate structure 80 includes a gate dielectric layer 82 and one or more conductive layers 84. In some embodiments, the gate dielectric layer 82 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, $La_2O_3$, $HfO_2$—$La_2O_3$, $Y_2O_3$, $Dy_2O_3$, $Sc_2O_3$, MgO or other suitable high-k dielectric materials, and/or combinations thereof.

In some embodiments, the conductive layers 84 include a barrier layer, one or more work function adjustment layers, a glue layer and a body metal layer. In some embodiments, the barrier layer includes a metal nitride, such as WN, TaN, TiN and TiSiN. In some embodiments, the work function adjustment layers include WN, WCN, Ru, TiAlN, AlN TaN, TiN, TiSiN, W, TaAlC, TiC, TaAl, TaC, Co, Al, TiAl, or TiAlC, or a multilayer of two or more of these materials. In some embodiments, the glue layer is made of one or more of TiN, Ti, and Co. In some embodiments, the body metal layer includes one or more layers of conductive material, such as polysilicon, aluminum, copper, titanium, tantalum, tungsten, cobalt, molybdenum, tantalum nitride, nickel silicide, cobalt silicide, TiN, WN, WCN, Ru, TiAl, TiAlN, TaCN, TaC, TaSiN, metal alloys, other suitable materials, and/or combinations thereof.

FIGS. 19-23 show various stages of a sequential manufacturing process of a semiconductor FinFET device according to embodiments of the present disclosure. It is understood that additional operations may be provided before, during, and after processes shown by FIGS. 19-23, and some of the operations described below can be replaced or eliminated in additional embodiments of the method. The order of the operations can be changed. Materials, configuration, processes and/or dimensions explained with respect to above embodiments may be applied to the following embodiments, and the detailed description thereof may be omitted.

Figure 19:
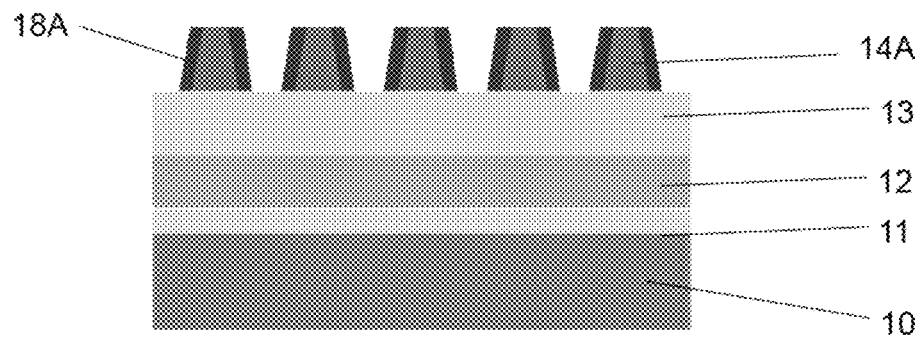
FIGS. 19, 20, 21, 22 and 23 show cross sectional views of various stages of a sequential manufacturing operation for a semiconductor device according to an embodiment of the present disclosure.
Figure 20:
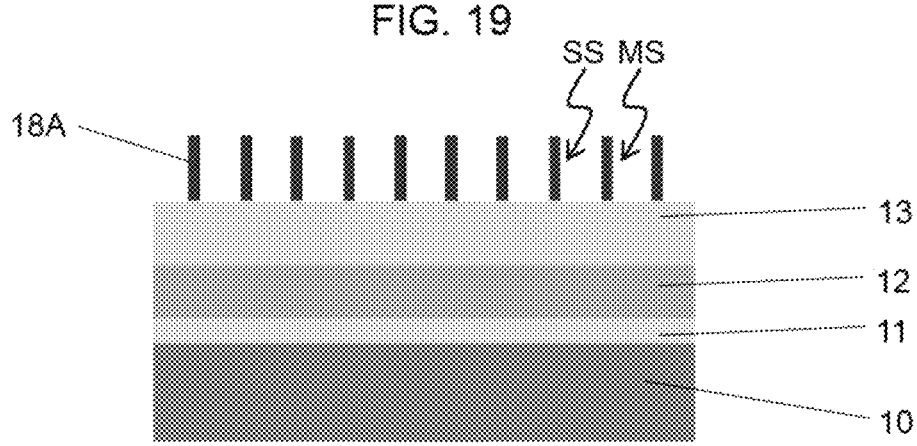
Figure 21:
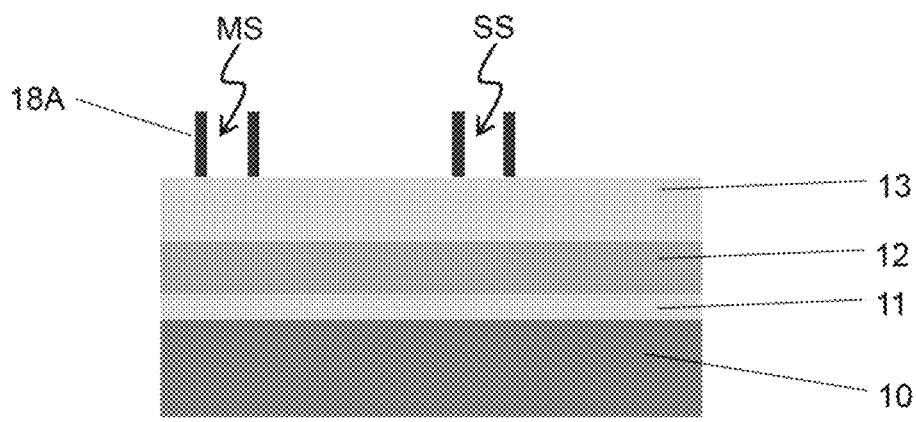
Figure 22:
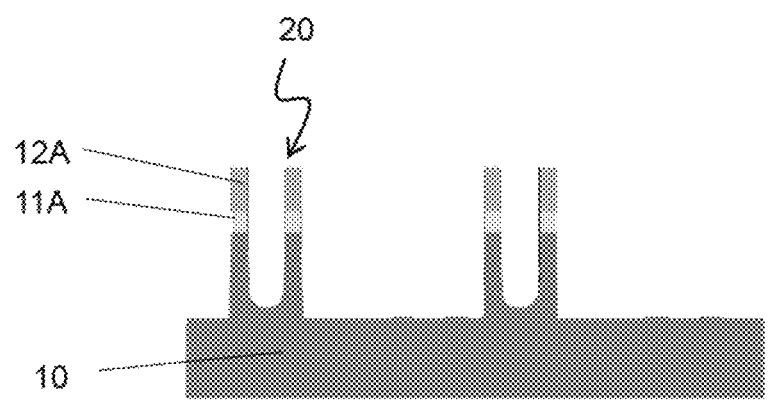
Figure 23:
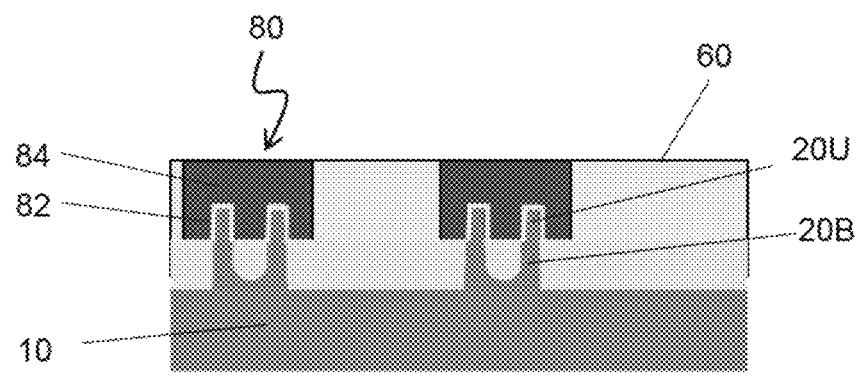

FIGS. 19 and 20 are the same as FIGS. 5 and 6. In some embodiments, in the fin cut operation explained with respect to FIG. 7, the remaining second hard mask pattern 18A constitutes one or more mandrel-space patterns MS and one or more spacer-space patterns SS, as shown in FIG. 21. Subsequently, the operations as explained with respect to FIGS. 9-13 are performed, thereby forming fin structures 20 as shown in FIG. 22. Further, the operations as explained with respect to FIGS. 14-18 are performed, thereby forming an isolation insulating layer 30 and a metal gate structure as shown in FIG. 23.

FIGS. 24A-24E show various stages of a sequential manufacturing process of a semiconductor FinFET device according to another embodiment of the present disclosure. It is understood that additional operations may be provided before, during, and after processes shown by FIGS. 24A-24E, and some of the operations described below can be replaced or eliminated in additional embodiments of the method. The order of the operations can be changed. Materials, configuration, processes and/or dimensions explained with respect to above embodiments may be applied to the following embodiments, and the detailed description thereof may be omitted.

Figure 24A:
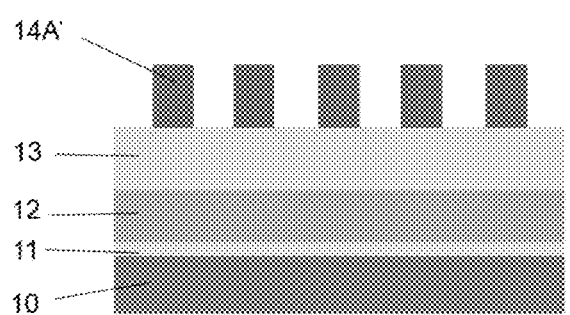
FIGS. 24A, 24B, 24C, 24D and 24E show cross sectional view of the various stages of a sequential manufacturing operation for a semiconductor device according to an embodiment of the present disclosure.
Figure 24B:
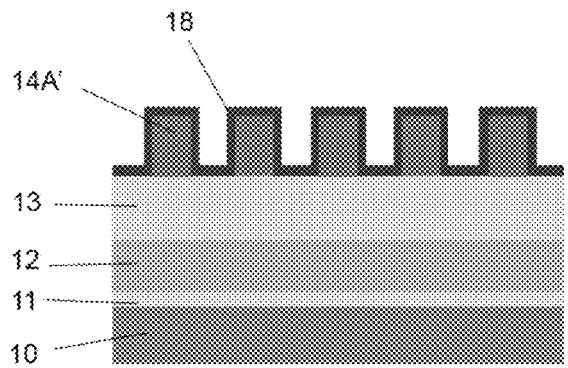
Figure 24C:
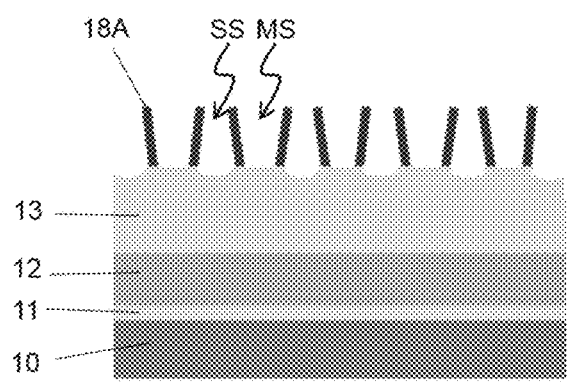
Figure 24D:
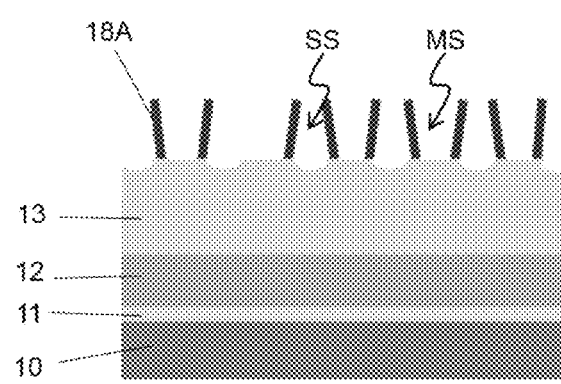

In another embodiments, as shown in FIG. 24A, the mandrel pattern 14A' has a substantially rectangular cross section having substantially vertical side faces. Then, similar to FIG. 4, the sixth layer 18 is conformally formed on the mandrel pattern 14A' and the exposed third layer 13. Next, similar to FIG. 5, anisotropic etching is performed on the sixth layer 18 to remove the horizontal portions of the sixth layer 18 deposited on the top of the mandrel patterns 14A' and the third layer 13 between the adjacent mandrel patterns. Then, similar to FIG. 6, the mandrel patterns 14A' are removed by one or more dry and/or wet etching operations, thereby leaving the sidewall spacers 18A as second hard mask patterns, as shown in FIG. 24C. FIG. 24D shows a cross sectional view after the fin cut process as explained with respect to FIGS. 7 and 8.

Here, due to intrinsic stress of the material of the sixth layer 18 (sidewall spacers 18A) and/or stress differences between the sixth layer 18 and the mandrel patterns 14A', after the mandrel pattern 14A' is removed, the sidewall spacers 18A incline in different (opposite) directions as shown in FIG. 24C. For example, when viewed from left to right, even number sidewall spacers incline toward the right and odd number sidewall spacers incline toward the left, thereby forming a narrow top space in the spacer-space SS and a wider top space in the mandrel-space MS. When the top space is wider, the additional hard mask layer 18B is deposited more in the mandrel-space MS, which causes a thicker sidewall spacer.

Figure 24E:
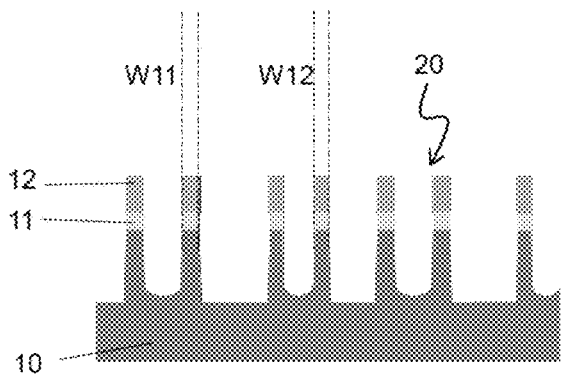

When the sidewall spacers 18A (second hard mask pattern) are inclined, when patterning the third layer 13 into the hard mask layer, the etching rates between the mandrel-space MS and the spacer-space SS may be different from each other, causing different dimensions (widths) of the patterned hard mask layer in some embodiments. In other embodiments, deposition amounts of the additional hard mask layer 18A (see, FIG. 9) may be different on the second hard mask patterns 18A at the mandrel-space MS and the spacer-space SS from each other, causing different dimensions (widths) of the patterned hard mask layer in some embodiments. For example, the deposition amount on the second hard mask patterns 18A on the sides facing the mandrel-space MS having the wider top space is greater than the deposition amount on the second hard mask patterns 18A on the sides facing the spacer-space MS having the narrower top space. This causes a wider pattern width for the second hard mask patterns 18A constituting the mandrel-space MS than the spacer-space SS. Accordingly, the fin structure 20 formed by the operations explained with respect to FIGS. 9-13 have different widths W11 and W12, where W11>W12, as shown in FIG. 24E.

In some embodiments, the fin structures formed from the sidewall spacers 18A constituting the mandrel-space MS have a greater width than the fin structures formed from the sidewall spacers 18A constituting the spacer-space SS. In some embodiments, the width variation between the fin structures formed from the mandrel-space MS and the fin structures formed from the spacer-space SS is about 0.3-0.5 nm. Moreover, the width variations within the fin structures formed from the mandrel-space MS or the fin structures formed from the spacer-space SS is about 7-10% of the average width, respectively.

In the embodiments, explained with respect to FIGS. 1-23, the mandrel pattern 14A has a trapezoidal cross section having inclined side faces, as shown in FIGS. 2 and 3. The trapezoidal shape compensates for inclination of the sidewall spacers 18A caused by the intrinsic stress. Accordingly, as shown in FIGS. 6 and 20, the second hard mask pattern 18A extends substantially perpendicular (vertical direction) to the third layer when the mandrel pattern is removed, thereby suppressing width variation of the fin structures 20. In some embodiments, in the case of FIGS. 18-23, the width variation between the fin structures formed from the mandrel-space MS and the fin structures formed from the spacer-space SS is about 0.01-0.1 nm in some embodiments, and is about 0.04-0.07 nm in other embodiments. Moreover, the width variations within the fin structures formed from the mandrel-space MS or the fin structures formed from the spacer-space SS is about 0.5-3% of the average width, respectively. In some embodiments, the average width is in a range from about 8 nm to 10 nm. In some embodiments, the width of the fin structure is measured at a level of the upper surface of the isolation insulating layer 30.

Figure 25:
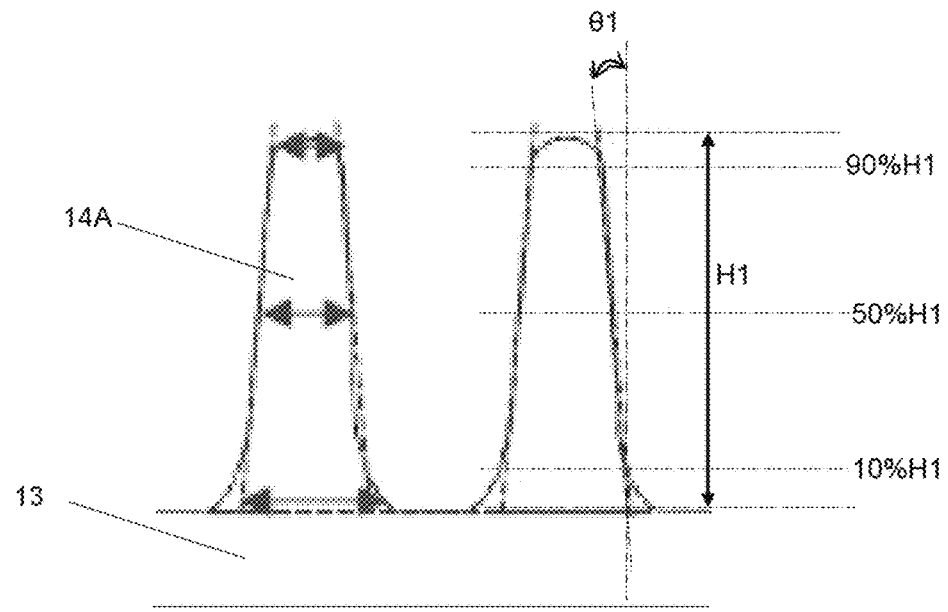
FIG. 25 shows a cross sectional view of one of the various stages of a sequential manufacturing operation for a semiconductor device according to an embodiment of the present disclosure.

FIG. 25 is a line drawing of a TEM (transmission electron microscope) image of the mandrel pattern 14A. In some embodiments, the sidewall of the mandrel pattern 14A is defined between 10% of the total height H1 of the mandrel pattern and the 90% of the height H1, and fitted by a linear line within this height range. The sidewall inclination angle $\theta 1$ between the fitted line of the sidewall and the vertical line is in a range from about 5 degrees to about 15 degrees in some embodiments, and is in a range from about 6 degrees to about 10 degrees in other embodiments. When the sidewall inclination angle $\theta 1$ is outside the ranges, the sidewall spacers 18A may undesirably incline, which may cause fin width variations.

In some embodiments, the ratio of the widths at 10% of H1 to 90% of H1 is in a range from about 1.3 to about 1.5 and the ratio of the widths at 50% of H1 to 90% of H1 is in a range from about 1.1 to about 1.3. When the ratio of the widths is outside the ranges, the sidewall spacers 18A may undesirably incline, which may cause fin width variations.

Figure 26:
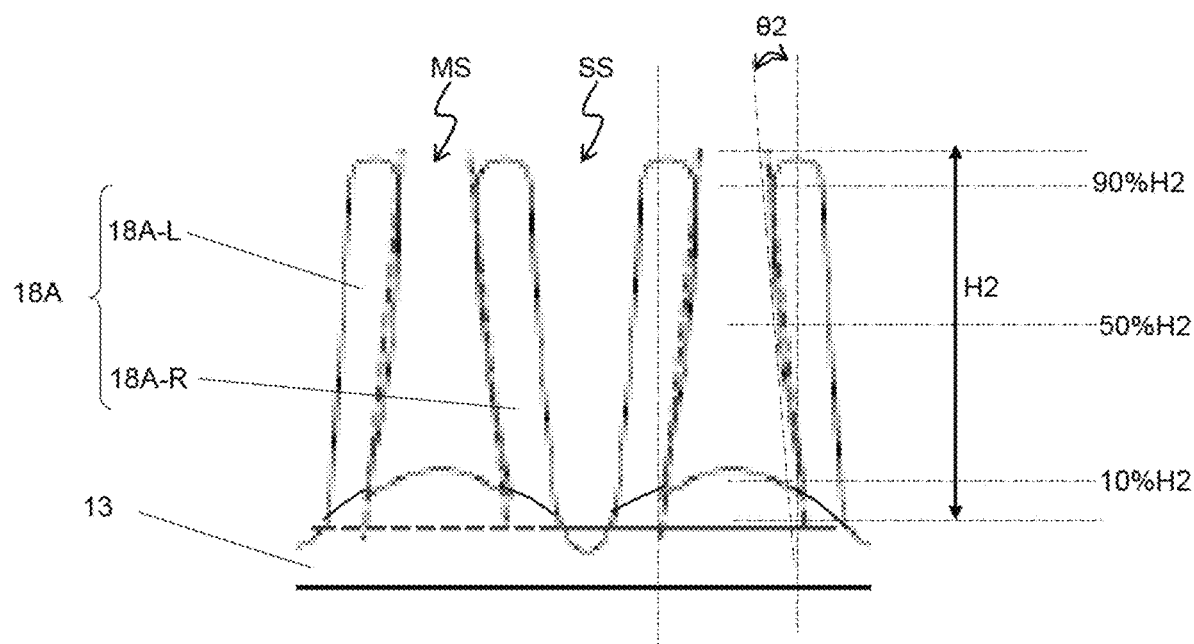
FIG. 26 shows a cross sectional view of one of the various stages of a sequential manufacturing operation for a semiconductor device according to an embodiment of the present disclosure.

FIG. 26 is a line drawing of a TEM image of the second hard mask pattern 18A. In some embodiments, the sidewall of the second hard mask pattern 18A is defined between 10% of the total height H2 of the second hard mask pattern (from the bottommost part) and the 90% of the height H2, and fitted by a linear line within this height range. The sidewall inclination angle θ2 between the fitted line of the sidewall and the vertical line is in a range from about −10 degrees (inclined to left (to the mandrel-space MS)) to about 5 degrees (inclined to right (to the spacer-space SS)) in some embodiments, and is in a range from about −7 degrees to about −1 degrees in other embodiments. In other embodiments, the inclination angle θ2 is in a range from about 1 degree to 7 degrees (e.g., 4-6 degrees) toward the spacer-space. In some embodiments, the inclination angle θ2 is not zero. When the sidewall inclination angle θ2 is outside the ranges, the sidewall spacers 18A may undesirably incline, which may cause fin width variations. As shown in FIG. 26, in some embodiments, the third layer 13 is etched more in the spacer-space SS than in the mandrel-space MS. During removal etching of the mandrel pattern 14A, the third layer 13 may be etched in some embodiments. In some embodiments, depending on the inclination angle θ2, the etching amount of the third layer 13 is smaller in the mandrel-space MS than in the space-space SS as shown in FIG. 14. In other embodiments, the etching amount of the third layer 13 is greater in the mandrel-space MS than in the space-space SS.

Figure 27A:
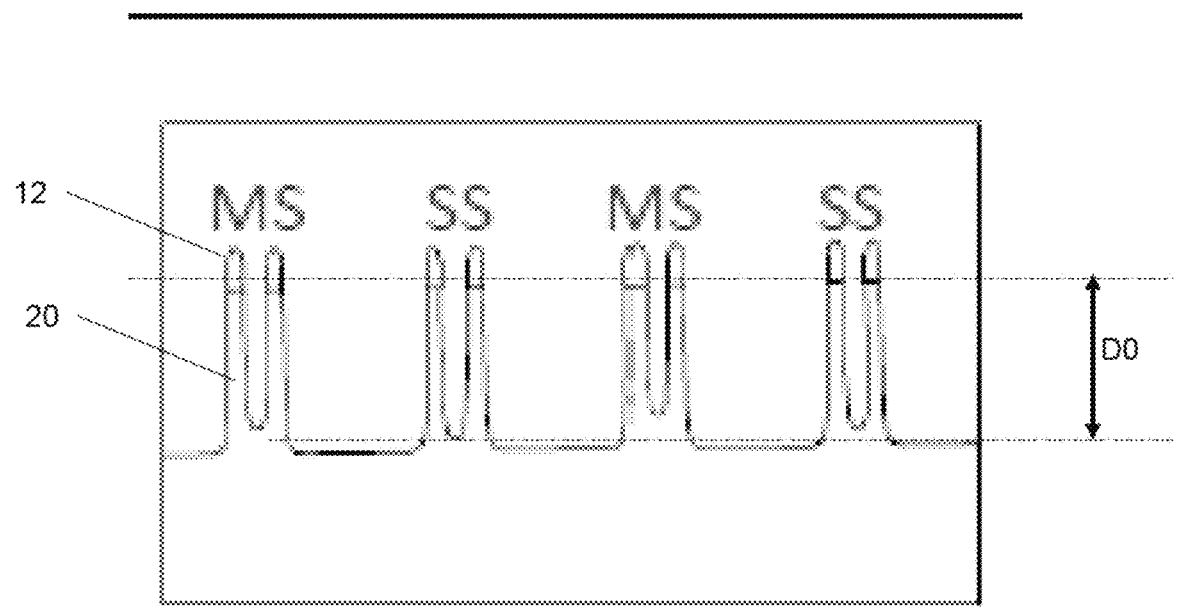
FIGS. 27A and 27B show cross sectional views of one of the various stages of a sequential manufacturing operation for a semiconductor device according to an embodiment of the present disclosure.
Figure 27B:
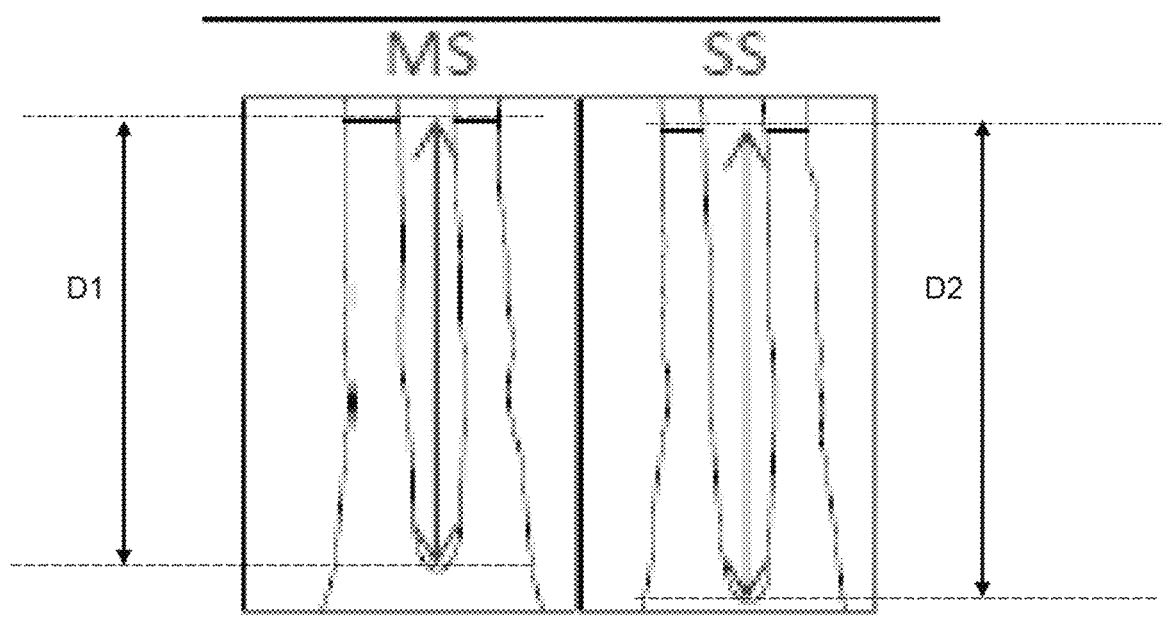

FIGS. 27A and 27B are line drawings of TEM images of the fin structures 20 corresponding to FIGS. 13 and 22.

As set forth above, the width of the fin structures formed from the mandrel-space MS is substantially the same as the width of the fin structures formed from the spacer-space SS. The differences in the width is about 0.2% to about 1.2% because of the use of trapezoidal mandrel patterns 14A.

In some embodiments, the depth of the space between adjacent fin structures may vary depending on whether the space is the mandrel-space MS or the spacer-space SS. In some embodiments, the depth D1 of the mandrel-space MS is smaller than the depth D2 of the spacer-space SS as shown in FIG. 27B. In some embodiments, D2/D1 is in a range from about 1.03 to about 1.05. In other embodiments, the depth D1 is greater than the depth D2. The depth differences may depend on the inclination angle θ2 in some embodiments.

Further, in the present embodiments, the second hard mask patterns 18A are designed to have a pitch P0 at the mandrel-space MS and the spacer-space SS (i.e., on the layout design). In some embodiments, the depth D0 between the second hard mask pattern having a pitch more than P0 (e.g., 2P0, 3P0, ...) (the space other than the mandrel-space MS and the spacer-space) is greater than the depths D1 and D2. In some embodiments, D0/D1 or D0/D2 is in a range from about 1.05 to about 1.15.

Figure 28:
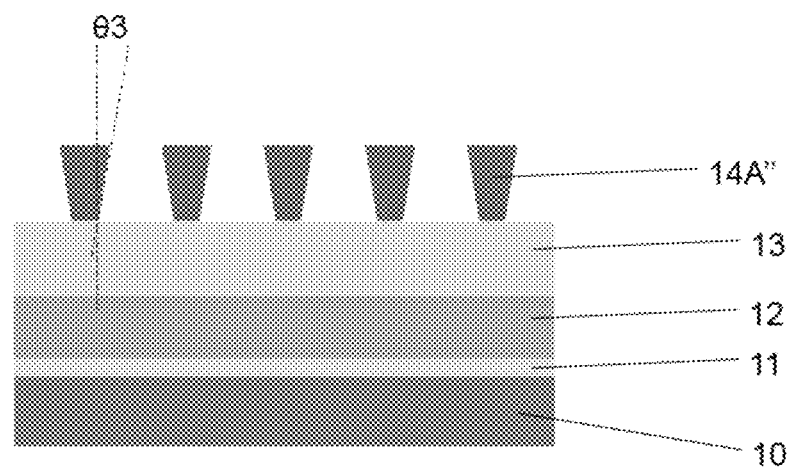
FIGS. 28, 29, and 30 show cross sectional views of one of the various stages of a sequential manufacturing operation for a semiconductor device according to an embodiment of the present disclosure.
Figure 29:
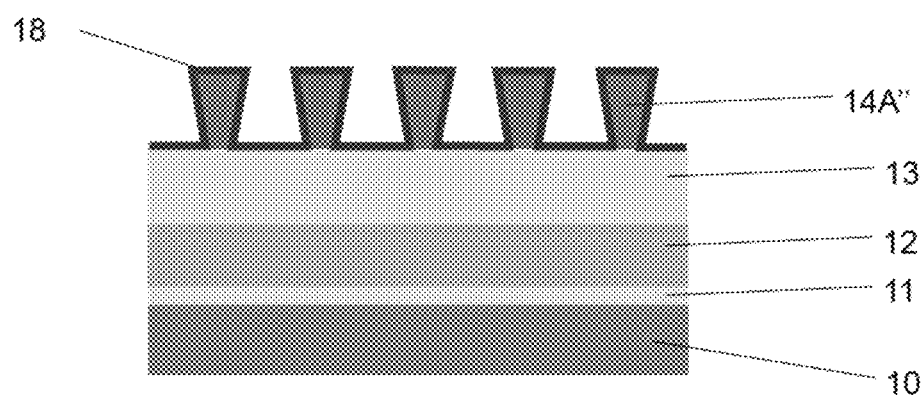
Figure 30:
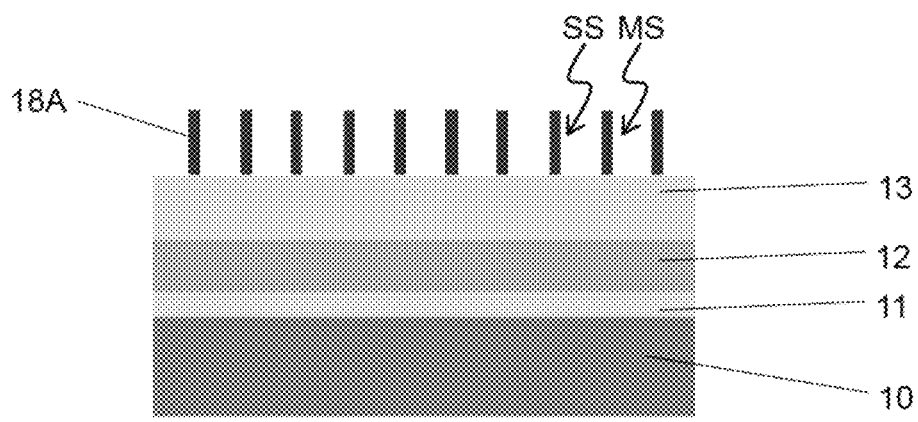

FIGS. 28-30 show various stages of a sequential manufacturing process of a semiconductor FinFET device according to embodiments of the present disclosure. It is understood that additional operations may be provided before, during, and after processes shown by FIGS. 28-30, and some of the operations described below can be replaced or eliminated in additional embodiments of the method. The order of the operations can be changed. Materials, configuration, processes and/or dimensions explained with respect to the above embodiments may be applied to the following embodiments, and the detailed description thereof may be omitted.

In some embodiments, depending on materials of the sixth layer 18 and/or the mandrel pattern 14A, after the mandrel pattern is removed, the sidewall spacers 18A incline in directions opposite to those shown in FIG. 24C due to internal stress differences. For example, when viewed from left to right even number sidewall spacers incline toward the left and odd number sidewall spacers incline toward the right, thereby forming a narrow top space in the mandrel-space MS and a wider top space in the spacer-space SS.

Accordingly, in the embodiments of FIGS. 28-30, to compensate for the subsequently cause pattern inclination, the mandrel patterns 14A" have a reverse tapered shape having a wider top and a smaller bottom as shown in FIG. 28. Then, as shown in FIG. 29, the sixth layer 18 is conformally formed on the mandrel pattern 14A" similar to FIG. 4. By the operation explained with respect to FIG. 5-6, the second hard mask pattern 18A which is substantially vertically extended can be obtained.

In some embodiments, the inclination angle θ3 is in a range from about 5 degrees to about 15 degrees in some embodiments, and is in a range from about 6 degrees to about 10 degrees in other embodiments. Definition of the inclination angle θ3 is the same as that of the inclination angle θ1 except for the angle measurement direction.

In some embodiments, the taper angle is adjusted by a feedback operation based on measurement of the inclination angle of the second hard mask pattern 18A after the mandrel pattern 14A is removed. When the second hard mask pattern 18A inclined more than a target inclination (criterion) such that the top space in the mandrel-space MS is wider than the top space in the spacer-space SS, the taper angle (inclination angle) θ1 is increased, and when the second hard mask pattern 18A inclined more than a target inclination such that the top space in the mandrel-space MS is smaller than the top space in the spacer-space, the taper angle (inclination angle) θ1 is decreased. The taper angle of the mandrel pattern 14A can be controlled by controlling one or more of etching gas kinds, flow rates of the etching gas, process pressure, process temperature and/or etching power (e.g., high-frequency power and/or DC bias power).

The various embodiments or examples described herein offer several advantages over the existing art. For example, in the present disclosure, the mandrel patterns have a tapered shape to compensate for the inclination of the sidewall spacers (the second hard mask pattern) after the mandrel patterns are removed, and thus it is possible to decrease variation in width of the fin structures patterned using a hard mask pattern formed from the sidewall spacers.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, sacrificial patterns are formed over a hard mask layer disposed over a substrate, sidewall patterns are formed on sidewalls of the sacrificial patterns, the sacrificial patterns are removed, thereby leaving the sidewall patterns as first hard mask patterns, the hard mask layer is patterned by using the first hard mask patters as an etching mask, thereby forming second hard mask patterns, and the substrate is patterned by using the second hard mask patterns as an etching mask, thereby forming fin structures. Each of the first sacrificial patterns has a tapered shape having a top smaller than a bottom. In one or more of the foregoing and following embodiments, the sacrificial patterns are made of poly silicon. In one or more of the foregoing and following embodiments, the first hard mask patterns are made of silicon nitride. In one or more of the foregoing and following embodiments, the first hard mask patterns are inclined. In one or more of the foregoing and following embodiments, an inclination angle of the first hard mask patterns is 1-7 degrees toward a space from which a corresponding one of the sacrificial patterns is removed. In one or more of the foregoing and following embodiments, an inclination angle of the first hard mask patterns is 1-7 degrees toward a space where no sacrificial pattern is formed. In one or more of the foregoing and following embodiments, a taper angle of sacrificial patterns is in a range from 5 degrees to 15 degrees. In one or more of the foregoing and following embodiments, the hard mask layer includes multiple layers of dielectric materials. In one or more of the foregoing and following embodiments, the sidewall patterns are formed by conformally forming a blanket layer by an atomic layer deposition, and performing anisotropic etching to remove horizontal part of the blanket layer.

In accordance with another aspect of the present disclosure, in a method of manufacturing a semiconductor device, a first hard mask layer is formed over a substrate, a sacrificial layer is formed over the first hard mask layer, a second hard mask layer is formed over the sacrificial layer, first hard mask patterns are formed by patterning the second hard mask layer, sacrificial patterns are formed by patterning the sacrificial layer using the first hard mask patterns as an etching mask, sidewall patterns are formed on sidewalls of the sacrificial patterns, the sacrificial patterns are removed, thereby leaving the sidewall patterns as second hard mask patterns, part of the second hard mask patterns is removed, after the part of the second hard mask patterns is removed, the hard mask layer is patterned by using the second hard mask patters as an etching mask, thereby forming third hard mask patterns, and the substrate is patterned by using the third hard mask patterns as an etching mask, thereby forming fin structures. Each of the first sacrificial patterns has a tapered shape. In one or more of the foregoing and following embodiments, an additional hard mask layer is further formed over the second hard mask layer. In one or more of the foregoing and following embodiments, an additional hard mask layer is further formed over the third hard mask layer. In one or more of the foregoing and following embodiments, the hard mask layer includes a first layer formed on the substrate, a second layer formed on the first layer and made of a different material than the first layer and a third layer formed on the second layer and made of a different material than the second layer. In one or more of the foregoing and following embodiments, the first layer and the third layer are made of a same material. In one or more of the foregoing and following embodiments, the second hard mask patterns includes a first pair of pattern structures from which a corresponding one of the sacrificial patterns is removed, and a second pair of pattern structures where no sacrificial pattern exist there between, and a width of the fin structures corresponding to the first pair of pattern structures is different from a width of the fin structures corresponding to the second pair of pattern structures. In one or more of the foregoing and following embodiments, a depth of a space between adjacent fin structures corresponding to the first pair of pattern structures is different from a depth of a space between adjacent fin structures corresponding to the second pair of pattern structures.

In accordance with another aspect of the present disclosure, in a method of manufacturing a semiconductor device, sacrificial patterns are formed over a hard mask layer disposed over a substrate, sidewall patterns are formed on sidewalls of the sacrificial patterns, the sacrificial patterns are removed, thereby leaving the sidewall patterns as first hard mask patterns, the hard mask layer is patterned by using the first hard mask patters as an etching mask, thereby forming second hard mask patterns, and the substrate is patterned by using the second hard mask patterns as an etching mask, thereby forming fin structures. Each of the first sacrificial patterns has a tapered shape, and a taper angle is adjusted such that an inclination angle of the first hard mask patterns is within a criterion. In one or more of the foregoing and following embodiments, each of the first sacrificial patterns has the tapered shape having a top smaller than a bottom. In one or more of the foregoing and following embodiments, the inclination angle of the first hard mask patterns is 1-7 degrees toward a space from which a corresponding one of the sacrificial patterns is removed. In one or more of the foregoing and following embodiments, the inclination angle of the first hard mask patterns is 1-7 degrees toward a space where no sacrificial pattern is formed.

In accordance with another aspect of the present disclosure, a semiconductor device includes a first fin field effect transistor including a first pair of fin structures and a first gate electrode disposed over the first pair of fin structures, and a second fin field effect transistor including a second pair of fin structures and a second gate electrode disposed over a second pair of fin structures. A width of the first pair of fin structures is different from a width of the second pair of fin structures by 0.01-0.1 nm. In one or more of the foregoing and following embodiments, a depth D1 of a space between the first pair of fin structures from a top of the first pair of fin structures is different from a depth D2 of a space between the second pair of fin structures from a top of the second pair of fin structures. In one or more of the foregoing and following embodiments, a ratio D2/D1 is in a range from 1.03 to 1.05. In one or more of the foregoing and following embodiments, the first pair of fin structures and the second pair of fin structures are separated by a distance greater than a space between the first pair of fin structures.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of manufacturing a semiconductor device, comprising:
 forming sacrificial patterns over a hard mask layer disposed over a substrate;
 forming sidewall patterns on sidewalls of the sacrificial patterns;
 removing the sacrificial patterns, thereby leaving the sidewall patterns as first hard mask patterns;

patterning the hard mask layer by using the first hard mask patterns as an etching mask, thereby forming second hard mask patterns; and patterning the substrate by using the second hard mask patterns as an etching mask, thereby forming fin structures, wherein each of the sacrificial patterns has a tapered shape having a top smaller than a bottom.

2. The method of claim 1, wherein the sacrificial patterns are made of poly silicon.

3. The method of claim 2, wherein the first hard mask patterns are made of silicon nitride.

4. The method of claim 3, wherein the first hard mask patterns are inclined with respect to a direction normal to an upper surface of the substrate.

5. The method of claim 4, wherein an inclination angle of the first hard mask patterns is 1-7 degrees toward a space from which a corresponding one of the sacrificial patterns is removed.

6. The method of claim 4, wherein an inclination angle of the first hard mask patterns is 1-7 degrees with respect to a direction toward a space where no sacrificial pattern is formed.

7. The method of claim 1, wherein a taper angle of the sacrificial patterns with respect to a direction normal to an upper surface of the substrate is in a range from 5 degrees to 15 degrees.

8. The method of claim 1, wherein the hard mask layer includes multiple layers of dielectric materials.

9. The method of claim 1, wherein the sidewall patterns are formed by conformally forming a blanket layer by atomic layer deposition, and performing anisotropic etching to remove a horizontal part of the blanket layer.

10. A method of manufacturing a semiconductor device, comprising:
    forming a first hard mask layer over a substrate;
    forming a sacrificial layer over the first hard mask layer;
    forming a second hard mask layer over the sacrificial layer;
    forming first hard mask patterns by patterning the second hard mask layer;
    forming sacrificial patterns by patterning the sacrificial layer using the first hard mask patterns as an etching mask, each of the sacrificial patterns having a tapered shape;
    forming sidewall patterns on sidewalls of the sacrificial patterns;
    removing the sacrificial patterns, thereby leaving the sidewall patterns as second hard mask patterns;
    removing part of the second hard mask patterns;
    after the removing part of the second hard mask, patterning the hard mask layer by using a remaining part of the second hard mask patterns as an etching mask, thereby forming third hard mask patterns; and
    patterning the substrate by using the third hard mask patterns as an etching mask, thereby forming fin structures.

11. The method of claim 10, further comprising forming an additional hard mask layer over the second hard mask layer.

12. The method of claim 10, further comprising forming an additional hard mask layer over the third hard mask patterns.

13. The method of claim 10, wherein the first hard mask layer includes a first layer formed on the substrate, a second layer formed on the first layer and made of a different material than the first layer and a third layer formed on the second layer and made of a different material than the second layer.

14. The method of claim 13, wherein the first layer and the third layer are made of a same material.

15. The method of claim 10, wherein:
    the second hard mask patterns include a first pair of pattern structures from which a corresponding one of the sacrificial patterns is removed, and a second pair of pattern structures where no sacrificial pattern exist therebetween, and
    a width of the fin structures corresponding to the first pair of pattern structures is different than a width of the fin structures corresponding to the second pair of pattern structures.

16. The method of claim 15, wherein a depth of a space between adjacent fin structures corresponding to the first pair of pattern structures is different from a depth of a space between adjacent fin structures corresponding to the second pair of pattern structures.

17. A method of manufacturing a semiconductor device, comprising:
    forming sacrificial patterns over a hard mask layer disposed over a substrate;
    forming sidewall patterns on sidewalls of the sacrificial patterns;
    removing the sacrificial patterns, thereby leaving the sidewall patterns as first hard mask patterns;
    patterning the hard mask layer by using the first hard mask patterns as an etching mask, thereby forming second hard mask patterns; and
    patterning the substrate by using the second hard mask patterns as an etching mask, thereby forming fin structures,
    wherein each of the sacrificial patterns has a tapered shape, and
    a taper angle of the tapered shape with respect to a direction normal to an upper surface of the substrate is adjusted such that an inclination angle of the first hard mask patterns is within a criterion.

18. The method of claim 17, wherein the tapered shape of each of the sacrificial patterns has a top smaller than a bottom.

19. The method of claim 18, wherein the inclination angle of the first hard mask patterns is 1-7 degrees toward a space from which a corresponding one of the sacrificial patterns is removed.

20. The method of claim 19, wherein the inclination angle of the first hard mask patterns is 1-5 degrees toward a space where no sacrificial pattern is formed.

* * * * *